US006184478B1

(12) United States Patent
Imano et al.

(10) Patent No.: US 6,184,478 B1
(45) Date of Patent: Feb. 6, 2001

(54) PRINTED WIRING DEVICE WITH BASE LAYER HAVING A GRID PATTERN

(75) Inventors: Hajime Imano; Yoshikazu Kato, both of Tokyo (JP)

(73) Assignee: Adtec Corporation, Tokyo (JP)

(*) Notice: Under 35 U.S.C. 154(b), the term of this patent shall be extended for 0 days.

(21) Appl. No.: 09/206,367

(22) Filed: Dec. 7, 1998

(30) Foreign Application Priority Data

Sep. 30, 1998 (JP) .................................................. 10-276852

(51) Int. Cl.[7] ................................. H01R 12/04; H05K 1/11
(52) U.S. Cl. ............................................. 174/261; 174/255
(58) Field of Search .................................. 174/255, 261; 361/794, 795; 428/209, 901

(56) References Cited

U.S. PATENT DOCUMENTS

| 5,016,085 | * | 5/1991 | Hubbard et al. ................... 357/74 |
| 5,348,792 | * | 9/1994 | Hattori et al. ................... 428/209 |
| 5,519,176 | * | 5/1996 | Goodman et al. .................. 174/255 |
| 5,633,479 | * | 5/1997 | Hirano .......................... 174/255 |

* cited by examiner

*Primary Examiner*—Jeffrey Gaffin
*Assistant Examiner*—Jeremy Norris
(74) *Attorney, Agent, or Firm*—Kanesaka & Takeuchi

(57) ABSTRACT

A printed wiring device includes an insulation layer, a base layer, i.e. grounding layer or power supply layer, disposed on the insulation layer, and a signal line disposed on the insulation layer at the opposite side of the base layer. A plurality of holes is formed in the base layer opposite to the signal line, so that an average capacitance value between the signal line and the base layer is decreased. Thus, even if the insulation layer is thinned without narrowing the width of the signal line, characteristic impedance of the signal line can be controlled at a desired value.

6 Claims, 2 Drawing Sheets

PRINTED WIRING DEVICE WITH BASE LAYER HAVING A GRID PATTERN

BACKGROUND OF THE INVENTION AND RELATED ART STATEMENT

The present invention relates to a printed wiring device, and more specifically, relates to a printed wiring or circuit device with a simple structure, wherein a high-speed digital circuit or a circuit which handles high speed signals can be mounted.

Conventionally, as a printed wiring or circuit device, a multilayer circuit board has been used in the field wherein densification or integration is required. FIG. 2(a) is a sectional view showing a structure of a conventional multilayer circuit board. The circuit board is structured such that five insulation layers 20 through 24 are laminated, and on both surfaces of the circuit board and between the respective insulation layers, a grounding layer 25, a power supply layer 26, and four signal line layers 27 through 30 are provided.

It has been employed that the grounding layer 25 and the power supply layer 26 have solid and plane patterns in order to lower impedance as well as to make the signal line function as a microstrip line, and further to achieve a shielding function between the layers. Then, a width of the signal line has been determined so that characteristic impedance as the microstrip line is matching with output impedance of a mounted circuit.

In recent years, it has been requested that the electronic device is miniaturized and has a lighter weight, and in accordance therewith, the circuit board with a large number of layers is necessary. However, in the conventional printed circuit board as described above, in order to increase the number of layers with the same thickness, it is necessary to reduce the thickness of the insulation layers.

The characteristic impedance of the signal line has a function of w/h, wherein the thickness of the insulation layer is h and the width of the signal line is w (referring to Takeshi Yoshida, "Revised High Frequency Design Know-How", printed by CQ Press on Jul. 1, 1997, pages 67–80). Therefore, in order to obtain the same characteristic impedance by using the same material as the insulation layer and halving the thickness h of the insulation layer, it is necessary to halve the width w of the signal line.

However, there have been the following problems. As the signal line is narrower, the inductance constituent in the signal line is increased, so that the high frequency constituent in the signal is decreased to cause the signal delay or deformation. Also, when the width of the signal line is reduced, the device can not be manufactured by the existing manufacturing equipment, resulting in increasing the manufacturing cost.

An object of the present invention is to solve the aforementioned problems, and to provide a printed wiring or circuit device with a simple structure, wherein a high-speed digital circuit or a circuit which handles high speed signals can be mounted.

Further objects and advantages of the invention will be apparent from the following description of the invention.

SUMMARY OF THE INVENTION

To achieve the aforementioned object, the present invention provides a printed wiring or circuit device, which has at least one of a grounding layer and a power supply layer, wherein the one of the layers is provided with a plurality of holes at least in an area opposed to a part of a signal line.

According to the present invention, a conductor layer constituting a ground side of a microstrip line is provided with a great number of holes in the area opposite to the signal line so as to reduce an average value of the capacitance between the signal line and the ground side. Therefore, there can be achieved the same operation as in a device wherein a thickness of an insulation layer is effectively increased, so that even if the insulation layer is thinned without narrowing the width of the signal line, the characteristic impedance of the signal line can be controlled at the desired value.

DETAILED DESCRIPTION OF PREFERRED EMBODIMENTS

Figure 1:
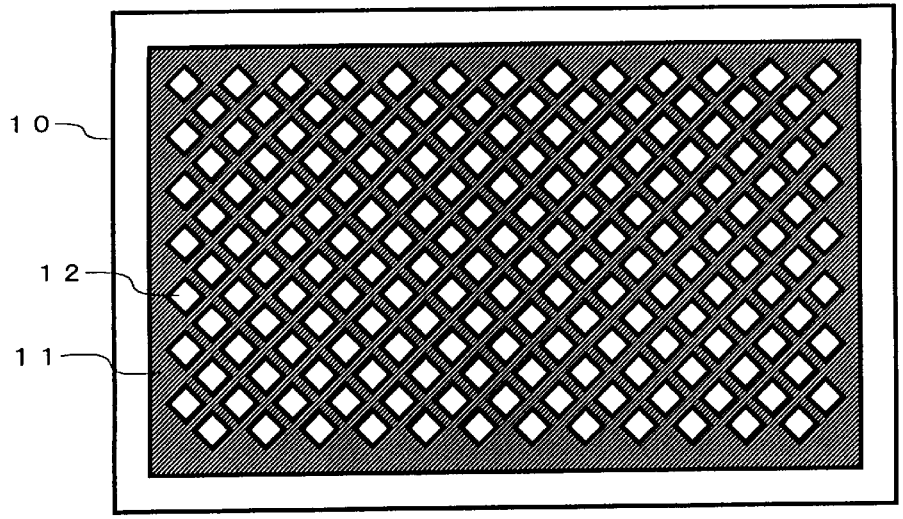
FIG. 1 is a sectional view showing a structure of a first embodiment of a grounding layer of a printed wiring or circuit device of the present invention.

Hereinafter, embodiments of the present invention will be explained with reference to the attached drawings. FIG. 1 is a sectional view showing a first embodiment of a grounding layer (GND layer) of a printed wiring or circuit device to which the present invention is applied. In a conventional base layer, i.e. grounding layer or power supply layer (VCC layer), the solid and plane pattern has been employed as described above, but in a pattern of a first embodiment, a great number of holes 12 is provided in a grounding layer 11 on a substrate 10. A size of the hole 12 ranges from 1/n to n times of the minimum width of the signal line wherein n is an integer of 2 to 9, preferably 2 to 5.

Figure 2A:
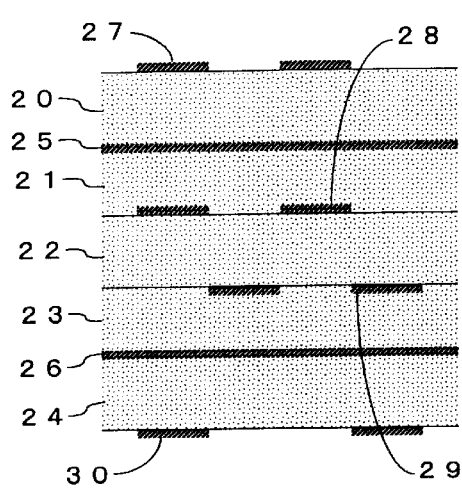
FIG. 2(a) is a sectional view showing a structure of a conventional multilayer circuit board.
Figure 2B:
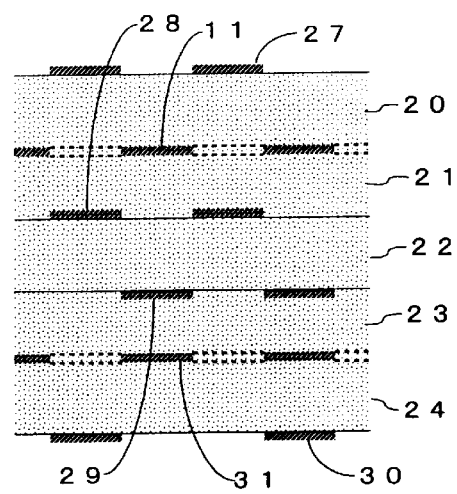
FIG. 2(b) is a sectional view showing a structure of a multilayer circuit board of the present invention.

FIG. 2(b) is a sectional view wherein the multilayer circuit board is cut perpendicularly to a surface of the circuit board. In this embodiment, five insulation layers 20 through 24 are laminated, and on both surfaces of the circuit board and between the respective insulation layers, there are provided the grounding layer 11, a power supply layer 31 and four signal line layers 27 through 30. As the insulation layer, for example, materials such as glass-epoxy, Teflon-glass, alumina and so on can be used. Also, as the grounding layer 11, the power supply layer 31 and the signal line layers 27 through 30, a metal such as a copper foil can be used.

Figure 3A:
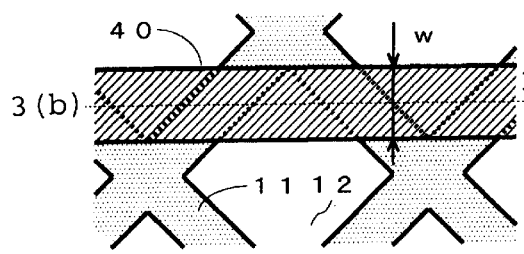
FIG. 3(a) is an explanatory view showing a positional relationship between a grounding layer and a signal line.
Figure 3B:
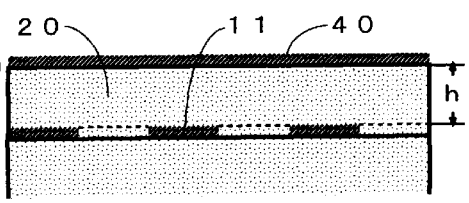
FIG. 3(b) is a cross sectional view taken along line 3(b)—3(b) in FIG. 3(a)

FIGS. 3(a) and 3(b) are explanatory views showing a positional relationship between the grounding layer 11 and a signal line 40.

For example, when only the grounding layer 11 and the signal line 27 (40) of the first embodiment shown in FIG. 2(b) are seen from a direction perpendicularly to a surface of a substrate, they are seen as in FIG. 3(a). Incidentally, FIG. 3(b) is a cross sectional view taken along line 3(b)—3(b) in FIG. 3(a). In the first embodiment, the signal line 40 is disposed so as to cover an approximately half of the diamond-shaped hole 12 in the grounding layer 11, in other words, so as not to overlap with an intersecting portion of a grid pattern of the grounding layer.

The characteristic impedance of a microstrip line is a function of capacitance and inductance per unit length of the signal line, and further, the capacitance and inductance are functions of the width w of the signal line and the thickness h of the insulation layer. Then, approximate formula of the characteristic impedance is a function of w/h when the thickness of the insulation layer is h and the width of the signal line is w as described above. And, as the value w/h is increased, the characteristic impedance is lowered.

In case the grounding layer is structured as shown in FIGS. 3(a) and 3(b), the area, in which the signal line pattern 40 and the grounding layer 11 are overlapped, is decreased approximately by half, and in accordance therewith, the capacitance per unit length (average value) between the layers is decreased. This works equivalently as in the device wherein the thickness h of the insulation layer is increased to decrease the capacitance.

Thus, in case the same material is used as the insulation layer and the thickness h of the insulation layer is halved, by using the pattern of the present invention to decrease the capacitance per unit length between the layers to half, the apparent thickness h of the insulation layer can be controlled to be the same as the original thickness. Thus, by using the pattern of the present invention, even if the thickness h of the insulation layer is decreased, without narrowing the width w of the signal line, the characteristic impedance of the signal line can be controlled at the desired value.

As the circuit board, a rectangle is used in most of the cases, and a signal line pattern is often disposed parallel to or perpendicularly to the sides of the circuit board. And, it is preferable that in a pattern of the grounding layer 11 or the power supply layer 31, average capacitance between the signal line 40 and the grounding layer 11 or the power supply layer 31 is the same no matter how the signal line is disposed.

In the first embodiment, for example, the grid pattern is formed so as to incline at 45 degrees with respect to the side of the circuit board, and an interval of the intersecting portions of the pattern is √2 times of a disposition interval of the signal lines (the distance parallel to the side is equal). Accordingly, the average capacitance of the signal line and the grounding layer or the power supply layer is made the same, and the signal line can be disposed with the minimum interval parallel to or perpendicularly to the side of the circuit board.

Incidentally, the pattern of the grounding layer or the power supply layer can be easily manufactured by the existing manufacturing technology.

Figure 4A:
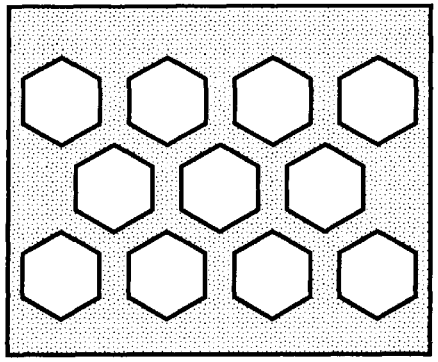
FIG. 4(a) through FIG. 4(c) are plan views showing patterns of other embodiments of the grounding layer according to the present invention.
Figure 4B:
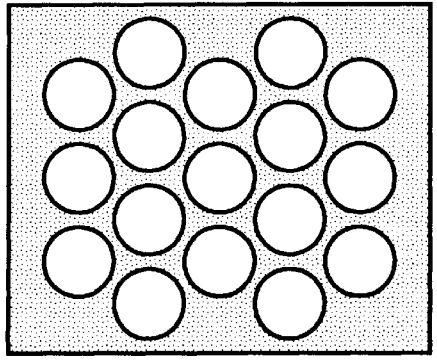
Figure 4C:
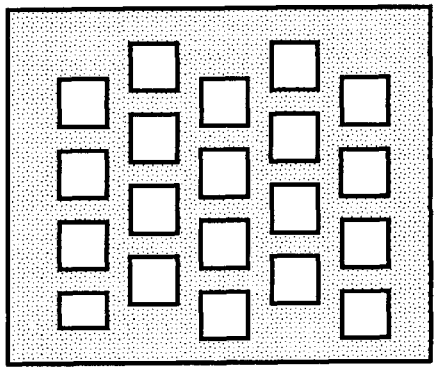

FIGS. 4(a)–4(c) are plan views showing patterns of other embodiments of the grounding layer of the printed wiring or circuit device to which the present invention is applied. FIG. 4(a) shows a pattern of a second embodiment in which regular hexagonal holes are arranged, and with the same characteristic impedance, the signal lines can be arranged with angles of 0 degree, 60 degrees, and 120 degrees with respect to the horizontal side.

FIG. 4(b) shows a pattern of a third embodiment in which circular holes are arranged, and with the same characteristic impedance, the signal lines can be arranged with angles of 0 degree, 60 degrees, and 120 degrees with respect to the horizontal side. FIG. 4(c) shows a pattern of a fourth embodiment in which square holes are arranged. Other than these patterns, as the shape of the hole, triangles, oval and rectangle can be employed, and as a method of disposing holes, a grid type arrangement and a close or high dense type arrangement can be considered. Furthermore, angles relative to the side of the circuit board and the pattern can be freely changed.

Figure 5:
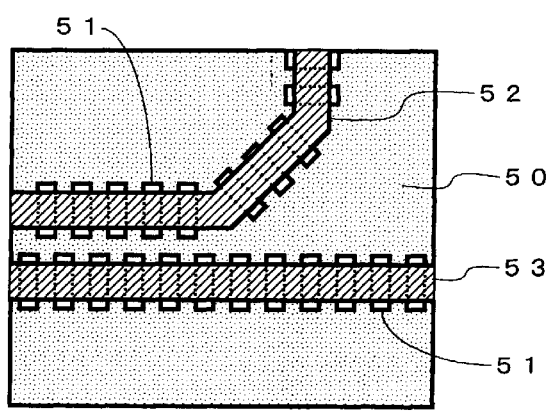
FIG. 5 is an explanatory view showing a structure of a fifth embodiment of the grounding layer.

FIG. 5 is an explanatory view showing a structure of a fifth embodiment. In case that the signal line and the grounding layer or the like constitute a microstrip line, an area of the grounding layer which effects the signal line is limited to the area opposite to the signal line and the vicinity thereof, and a pattern of an area away from the signal line has almost nothing to do with the characteristic impedance of the signal line.

Thus, in the fifth embodiment, a grounding layer 50 is provided with a number of holes 51 only in the areas opposite to signal lines 52, 53, and other areas of the grounding layer 50 have a solid and plane pattern. Shapes of the hole and intervals therebetween can be freely decided as in the aforementioned embodiments. By the structure of this embodiment, positions and directions of the signal lines are freely designed at first, and then the holes 51 in the grounding layer or the like are provided only along the signal lines, so that a degree of freedom in the design can be increased. Also, since the areas not forming the microstrip line are made to be a solid pattern, there is an effect that the impedance is lowered and the shielding effect is increased as compared to the aforementioned embodiments.

Although the embodiments of the invention are described above, further modified examples can be considered as follows according to the present invention. As to the sizes of the holes 12, 51, if the sizes are too large, the shielding effect between the layers is decreased, and the characteristic impedance is changed extremely in the area with the grounding layer and in the area without it, so that mismatch of the impedances or reflection in accordance therewith might occur. Thus, it is preferable that the size of the hole is small. However, if the size of the hole is too small as compared to the thickness h of the insulation layer, a decreasing effect of the capacitance is disappeared, and manufacturing of the device becomes difficult. Therefore, in consideration of these factors, the most desirable size is determined.

Although the embodiments disclose the examples in which the present invention is applied in the multilayer circuit board, the present invention can be applied to any circuit boards such as a two-layer circuit board and a flexible circuit board.

As described above, in the present invention, since a conductor layer constituting a ground side of the microstrip line is provided with a number of holes in an area opposite to the signal line so as to decrease the average capacitance value between the signal line and the ground, there can be obtained the same operation as in a device wherein a thickness of an insulation layer is effectively increased. Thus, even if the insulation layer is thinned without narrowing the width of the signal line, there is an effect that the characteristic impedance of the signal line can be controlled at the desired value. Thus, the present invention can provide a printed wiring device with a simple structure, wherein a high-speed digital circuit or a circuit which handles high speed signals can be mounted.

While the invention has been explained with reference to the specific embodiments of the invention, the explanation is illustrative and the invention is limited only by the appended claims.

What is claimed is:

1. A printed wiring device comprising:

an insulation layer, at least one signal line layer having signal lines arranged parallel to each other at a predetermined interval and disposed on one side of the insulation layer, and a base layer used for one of a grounding layer and a power supply layer and disposed on the insulation layer at a side opposite to the at least one signal line layer, said base layer having a plurality of holes with a size so that characteristic impedance of the signal lines is set in a predetermined value, said holes being arranged regularly in a grid pattern having line portions and intersecting portions so that the signal lines incline at an acute angle to a line linking centers of adjacent holes in a row of the holes without overlapping the intersecting portions.

2. A printed wiring device according to claim 1, wherein said holes are shaped and arranged such that a shielding effect is not deteriorated.

3. A printed wiring device according to claim 1, wherein each of said holes has one of a diamond shape, a hexagonal shape, circular shape and a square shape.

4. A printed wiring device according to claim 1, wherein said acute angle is 45 degrees or 60 degrees, and a distance between the signal lines is substantially same as a width of each of the signal lines.

5. A printed wiring device according to claim 4, wherein each of said holes has a square shape, and a diagonal line of the square shape is arranged parallel to or perpendicular to the signal lines.

6. A printed wiring device according to claim 4, wherein each of said holes has a circular shape.

* * * * *